(12) United States Patent
Zhou

(10) Patent No.: US 10,290,629 B2
(45) Date of Patent: May 14, 2019

(54) PROTECTIVE CIRCUIT FOR CATHODE LAYER, PROTECTIVE METHOD AND OLED DISPLAY DEVICE

(71) Applicant: BOE TECHNOLOGY GROUP CO., LTD., Beijing (CN)

(72) Inventor: Weifeng Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 187 days.

(21) Appl. No.: 15/095,453

(22) Filed: Apr. 11, 2016

(65) Prior Publication Data

US 2017/0005084 A1 Jan. 5, 2017

(30) Foreign Application Priority Data

Jul. 1, 2015 (CN) .......................... 2015 1 0379888

(51) Int. Cl.
- *G09G 3/3208* (2016.01)
- *H01L 27/02* (2006.01)
- *H01L 27/32* (2006.01)
- *H01L 51/52* (2006.01)

(52) U.S. Cl.
CPC ....... *H01L 27/0296* (2013.01); *G09G 3/3208* (2013.01); *H01L 27/3276* (2013.01); *H01L 27/3288* (2013.01); *H01L 51/5221* (2013.01); *H01L 51/5253* (2013.01); *G09G 2300/023* (2013.01); *G09G 2300/0426* (2013.01);
(Continued)

(58) Field of Classification Search
CPC ........... G09G 3/3208; G09G 2300/023; G09G 2330/04; G09G 2330/06; G09G 2300/0426; G09G 2330/021; H01L 51/5221; H01L 51/5253; H01L 27/3276; H01L 27/3288
See application file for complete search history.

(56) References Cited

U.S. PATENT DOCUMENTS

| | | | |
|---|---|---|---|
| 6,424,093 B1 * | 7/2002 | Mir .......................... | G09F 9/30 313/506 |
| 2007/0046592 A1 * | 3/2007 | Ono ..................... | G09G 3/3233 345/77 |

(Continued)

OTHER PUBLICATIONS

Shin et al. (Dynamic Voltage Scaling of OLED Displays, Proceeding, DAC '11 Proceedings of the 48th Design Automation Conference, pp. 53-58).*

*Primary Examiner* — Stacy Khoo
(74) *Attorney, Agent, or Firm* — Dilworth & Barrese, LLP.; Michael J. Musella, Esq.

(57) ABSTRACT

A protective circuit for a cathode layer, a protective method and an OLED display device are provided. The protective circuit includes a power supply, and an electronic output node electrically connected with a negative electrode of the power supply. Electric potential of the electronic output node is the same as the electric potential of the cathode layer in a working state of the OLED display device, the electronic output node is connected to the cathode layer of the OLED display device, and a positive electrode of the power supply is connected to a voltage node with any potential other than an anode of the OLED display device via a wire, so that electrons can be continuously provided by the power supply to the cathode layer in a non-working state of the OLED display device.

11 Claims, 3 Drawing Sheets

(52) U.S. Cl.
CPC ... *G09G 2330/021* (2013.01); *G09G 2330/04* (2013.01); *G09G 2330/06* (2013.01)

(56) References Cited

U.S. PATENT DOCUMENTS

| | | | | |
|---|---|---|---|---|
| 2009/0206764 A1* | 8/2009 | Schemmann | ........ | G09G 3/3258 315/241 R |
| 2010/0084990 A1* | 4/2010 | Ang | .................... | H05B 33/0809 315/291 |
| 2015/0022561 A1* | 1/2015 | Ikeda | .................... | G06F 1/1652 345/690 |

* cited by examiner

PROTECTIVE CIRCUIT FOR CATHODE LAYER, PROTECTIVE METHOD AND OLED DISPLAY DEVICE

TECHNICAL FIELD

The present disclosure relates to a protective circuit for a cathode layer, a protective method and an OLED display device.

BACKGROUND

Flat panel display technology has developed rapidly in recent years, and both the size of screen and the display quality have made great progress. Especially for an OLED (Organic Light-Emitting Diode) display device, its performance in various aspects has reached the level of a conventional LCD (Liquid Crystal Display), and there is a trend for it to replace the LCD.

However, current OLED display devices are still affected by factors such as low yield and so on, and the production cost is relatively high. The main factor affecting the yield is the packaging of OLED display devices. All of the current packaging structures adopt an "obstruction" approach, in which various different water/oxygen blocking materials are added to OLED devices, so as to impede water and oxygen from entering the devices, but the absolution security and integrity cannot be guaranteed by this packaging mode. Thus, such a problem that a cathode is corroded by water and oxygen cannot be solved fundamentally. This leads to the fact that in a non-working state of an OLED display device, water and oxygen create oxidation reactions with a cathode layer, and thus the OLED display device is destroyed.

SUMMARY

One embodiment of the present disclosure provides a protective circuit for a cathode layer, applied to a non-working state of an OLED display device, wherein, the protective circuit comprises a power supply, and an electronic output node electrically connected with a negative electrode of the power supply; wherein, an electric potential of the electronic output node is the same as an electric potential of the cathode layer in a working state of the OLED display device, the electronic output node is connected to the cathode layer of the OLED display device, and a positive electrode of the power supply is connected to a voltage node with any potential other than an anode of the OLED display device via a wire, so that electrons can be continuously provided by the power supply to the cathode layer in a non-working state of the OLED display device.

Another embodiment of the present disclosure provides an OLED display device, comprising a protective circuit, wherein, the protective circuit includes a power supply, and an electronic output node electrically connected with a negative electrode of the power supply; wherein, an electric potential of the electronic output node is the same as an electric potential connected to the cathode layer in a working state of the OLED display device, the electronic output node is connected to the cathode layer of the OLED display device, and a positive electrode of the power supply is connected to a voltage node with any potential other than an anode of the OLED display device via a wire, so that electrons can be continuously provided by the power supply to the cathode layer in a non-working state of the OLED display device.

Another embodiment of the present disclosure provides a method for protecting a cathode layer of an OLED display device, the OLED device comprising the cathode layer and a packaging structure formed on the cathode layer, the method comprising: in a non-working state of the OLED display device, a negative potential is provided to the cathode layer of the OLED display device.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the prevent invention will be further described in detail in connection with the drawings. It is obvious that the described embodiments are just a part but not all of the embodiments of the invention. Based on the embodiments in the invention, those ordinarily skilled in the art can obtain other embodiment(s), without any inventive work, which should be within the scope sought for protection by the invention.

Technical solutions of the prevent invention will be described below in detail with specific embodiments, and the invention includes but is not limited to the following embodiments.

Figure 1A:
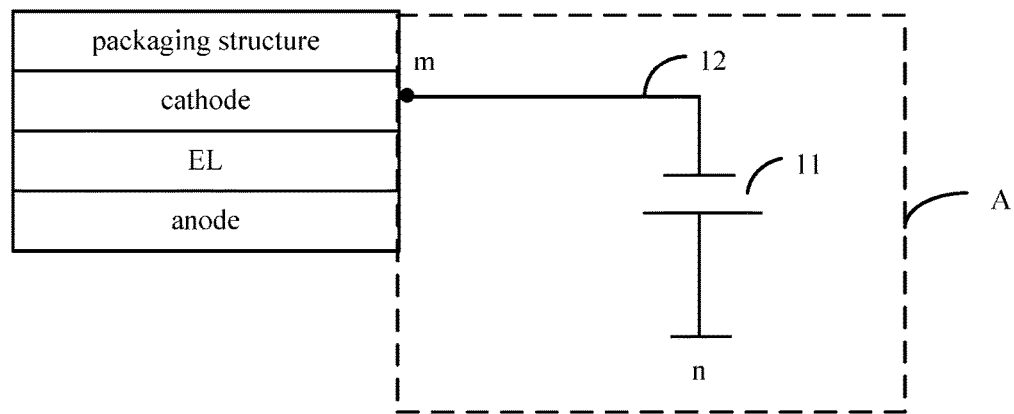
FIG. 1(a) to FIG. 1(b) are schematic views illustrating a protective circuit for a cathode layer provided by an embodiment of the invention.

As illustrated in FIG. 1(a), which is a schematic view illustrating a protective circuit for a cathode layer provided by an embodiment of the present disclosure, the protective circuit A is applied to a non-working state of an OLED display device, and it includes a power supply 11, and an electronic output node m communicated (electrically connected) with a negative electrode of the power supply 11.

An electric potential of the electronic output node m is the same as an electric potential of a cathode layer of the OLED display device in a working state, the electronic output node m is connected to the cathode layer of the OLED display device, and a positive electrode of the power supply 11 is connected to a voltage node n with any electric potential other than an anode of the OLED display device via a wire 12. When the protective circuit A plays its role, a conduction circuit is formed by the protective circuit A, the cathode layer and the voltage node n, so that electrons can be continually provided by the power supply to the cathode layer in a non-working state of the OLED display device. In the protective circuit A, parts in need of electric connection, for example, may be connected with a wire 12.

Figure 1B:
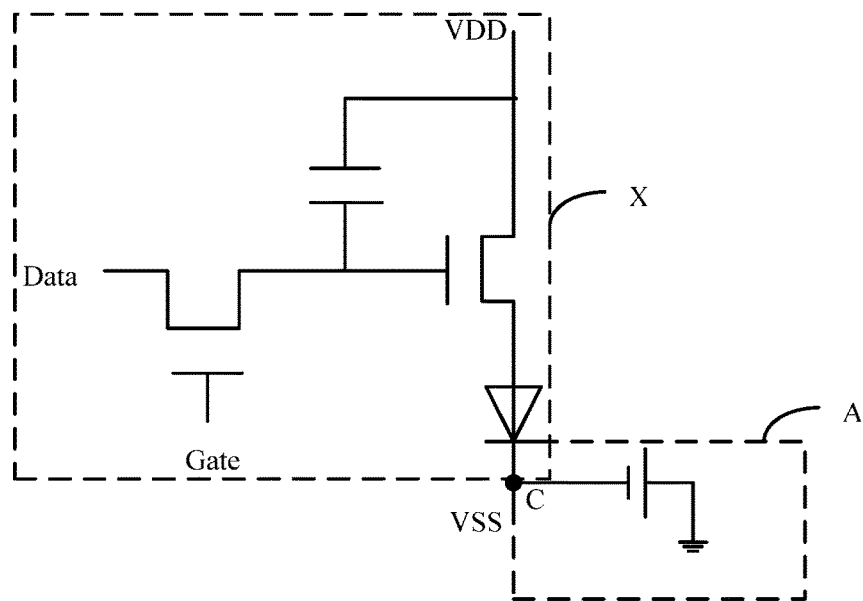

As illustrated in FIG. 1(b), which is a principle diagram illustrating the circuit integration of an internal circuit X of an OLED display device and a protective circuit A provided by the present disclosure, when the OLED display device lies in a working state, a high level is applied to a VDD node connected to an anode of the OLED display device, and a low level is applied to a Vss node connected to a cathode of the OLED display device. When the OLED display device lies in a non-working state, the internal circuit X is disconnected, namely, the Vss node has not any electric potential applied thereto, and at this time, the protective circuit plays its role, and starts to continuously provide the cathode with electrons by utilizing the negative electrode of the power supply 11. Thus, the situation that a cathode layer is corroded by water and oxygen when an OLED display device is in a non-working state is avoided, and the service life and performance of the OLED display device are promoted.

For example, the protective circuit involved in embodiments of the present disclosure may have several circuit structures as follows.

Circuit Structure 1

Figure 2:
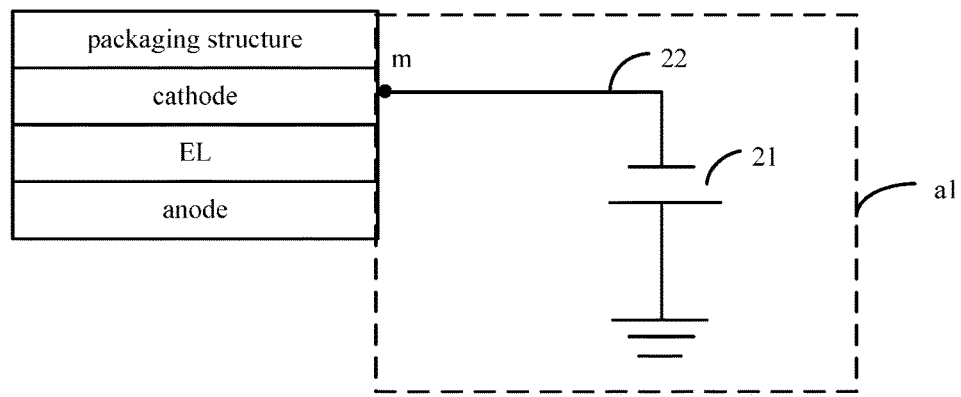
FIG. 2 is a schematic view illustrating a protective circuit a1 in a circuit structure 1 in an embodiment of the invention.

As illustrated in FIG. 2, the voltage of a power supply 21 in the protective circuit a1 is equal to the working voltage of an OLED display device, and a negative electrode of the power supply 21 is directly communicated with an electronic output node. It is assumed that, the working voltage of the OLED display device is Vss, namely, the electric potential of signal connected to a cathode layer of the OLED display device in a working state is Vss, and meanwhile, the protective circuit a1 is accessed from the cathode layer via the electronic output node m. At this time, a low potential Vss is provided to the electronic output node m through a negative electrode of the power supply 21, and a positive electrode of the power supply 21 is grounded through a wire 22. Consequently, it can be assured that electrical potential that is output from the power supply 21 to the electronic output node m is Vss.

In the protective circuit a1, on one hand, although the protective circuit a1 is mainly exercising the role of being capable of providing electrons in a non-working state of the OLED display device, owing to the fact that the protective circuit a1 has been kept in electric connection with a cathode layer of the OLED display device, a low potential is still provided in a working state of the OLED display device. In this case, in order that electric potential of the electronic output node m can be assured of being uniform, electric potential provided by the power supply 21 to the electronic output node m needs to be adjusted to be the same as electric potential of a Vss signal connected to a cathode layer of the OLED display device in a working state. On the other hand, with help of the electronic output node m, the cathode layer and the protective circuit a1 are connected together, thereby realizing continuous provision of the Vss signal to the electronic output node m from the power supply 21, and ensuring that its cathode layer still can receive electrons continuously in a non-working state (in which a Vss signal connected to the cathode layer is disconnected and provides no electron) of the OLED display device. Thus, when external water and oxygen enter the cathode layer, they will not react with electrons of the cathode metal, but react with electrons provided by the power supply 21. Consequently, the situation that a cathode layer is corroded by water and oxygen when an OLED display device is in a non-working state is avoided, and the service life and performance of the OLED display device are promoted.

Circuit Structure 2

Figure 3:
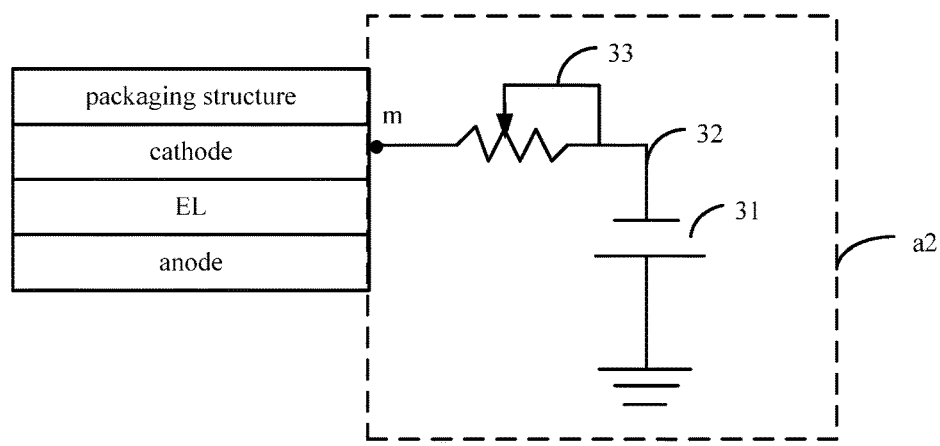
FIG. 3 is a schematic view illustrating a protective circuit a2 in a circuit structure 2 in an embodiment of the invention.

As illustrated in FIG. 3, a voltage of a power supply 31 in a protective circuit a2 is greater than the working voltage of an OLED display device, and besides a wire 32, the protective circuit a2 further includes a voltage adjusting element 33, for adjusting potential of an electron output node m, wherein, a negative electrode of the power supply 31 is communicated with the electron output node m via the voltage adjusting element 33. Still taking it as an example that the potential of signal connected to a cathode layer in a working state of an OLED display device is Vss, because voltage of the power supply 31 at this time is greater than Vss, a negative electrode of the power supply 31 may not be directly connected to an electronic output node m via a wire 32. It is necessary that potential of the electronic output node m be adjusted to be Vss with the provided voltage adjusting element 33. Thus, electrons are provided continuously to a cathode layer. A positive electrode of the power supply 31 may be connected to a voltage node with any electric potential other than an anode of the OLED display device, and for example, it may be grounded through a wire 32.

For example, the voltage adjusting element 33 concerned may be a slide rheostat.

The circuit structure 2 has the same effects as the circuit structure 1. In addition, due to provision of the voltage adjusting element 33 in the circuit structure 2, the voltage selective range of the power supply 31 is expanded, and flexibility of the circuit is enhanced.

Circuit Structure 3

Based on the protective circuits in the above circuit structure 1 and circuit structure 2, it may further include a switching element, one end of which is connected to an electron output node, and the other end of which is connected to a cathode layer. In a working state of an OLED display device, the switching element is turned off, so that connection between the electron output node and the cathode layer is disconnected; and in a non-working state of the OLED display device, the switching element is turned on, so that the electron output node is connected to the cathode layer.

Figure 4A:
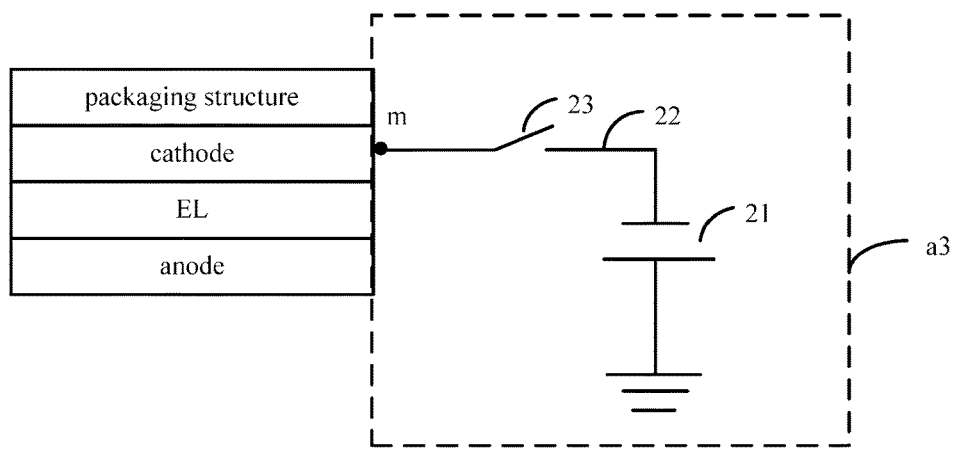
FIG. 4(a) to FIG. 4(c) are schematic views illustrating three protective circuits in a circuit structure 3 in an embodiment of the invention, respectively.

As illustrated in FIG. 4(a), which is a schematic view illustrating the circuit construction of a protective circuit a3 after a switching element 23 is added to the circuit structure a1, a power supply 21, a wire 22 and the switching element 23 are included in the protective circuit a3. One end of the switching element 13 is connected to an electron output node m via the wire 22, and the other end of it is connected to a cathode layer via the wire 22. It's working principle is that, in a working state of the OLED display device, the switching element 23 is turned off, so that connection between the electron output node m and the cathode layer is disconnected; and in a non-working state of the OLED display device, the switching element 23 is turned on, so that the electron output node m is connected to the cathode layer.

It is to be noted that, in embodiments of the invention, the switching element concerned may be a switching element in any form, and the present invention does not set a limit to this.

Additionally, a switching element 34 may also be added to the protective circuit a2, and its principle is similar to the principle after the switching element 23 is added to the above protective circuit a1, details being omitted here. Hereinafter, deformed protective circuits a2 in which a switching element 34 is located at two different locations are mainly introduced.

Figure 4B:
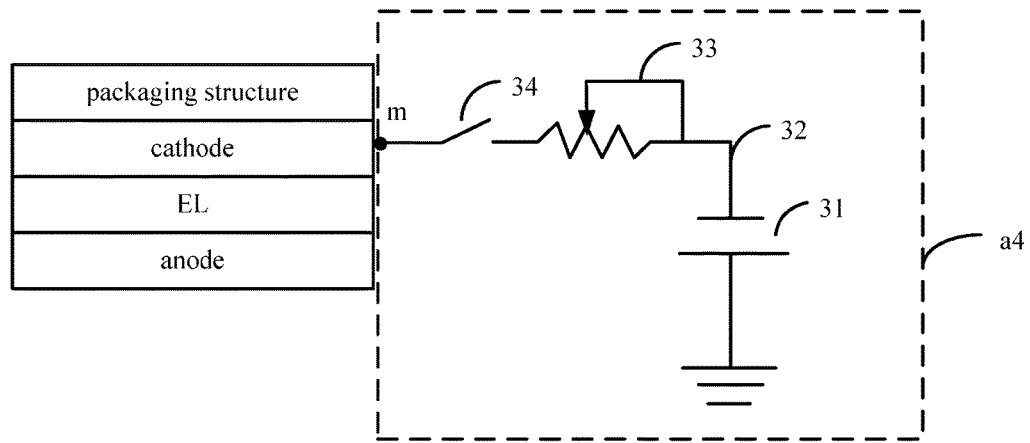

As illustrated in FIG. 4(b), which is a schematic view illustrating the circuit construction of a protective circuit a4 after a switching element 34 is added, the protective circuit a4 further includes the switching element 34; one end of which is connected to an electronic output node m, and the other end of which is connected to a voltage adjusting element 33. In a working state of the OLED display device, the switching element 34 is turned off, so that connection between the electronic output node m and the voltage adjusting element 33 is disconnected; and in a non-working state of the OLED display device, the switching element 34 is turned on, so that the electronic output node m is connected to the voltage adjusting element 33.

Figure 4C:
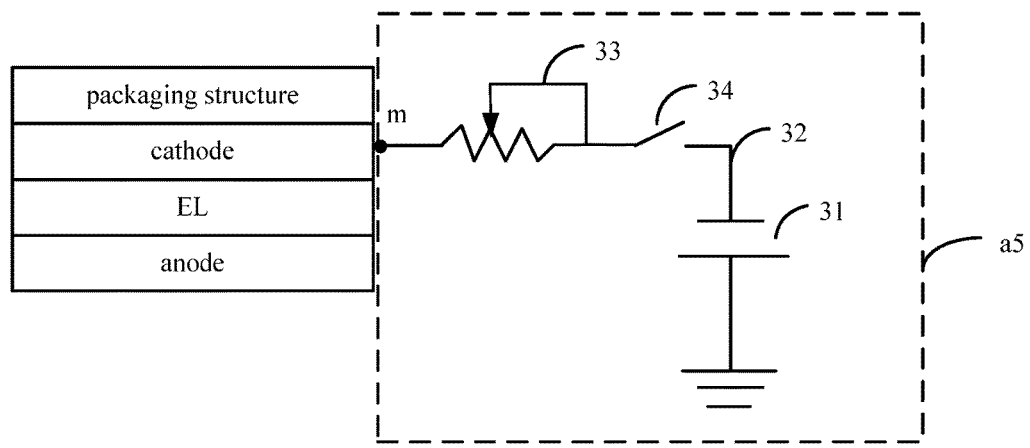

As illustrated in FIG. 4(c), which is a schematic view illustrating the circuit construction of another protective circuit a5 after a switching element 34 is added, the protective circuit a5 further includes the switching element 34; one end of which is connected to a voltage adjusting element 33, and the other end of which is connected to a negative electrode of a power supply 31. In a working state of the OLED display device, the switching element 34 is turned off, so that connection between the voltage adjusting element 33 and the negative electrode of the power supply 31 is disconnected; and in a non-working state of the OLED display device, the switching element 34 is turned on, so that the voltage adjusting element 33 is connected to the negative electrode of the power supply 31.

In the above circuit structures 3, owing to addition of a switching element to a protective circuit, on-off changeover of the switch can be conducted between a working state and a non-working state of the OLED display device. Therefore, there is no need to adjust and define electric potential of an electronic output node m to be the same as potential of Vss connected to a cathode in the working state of the OLED display device, as long as a low potential is output from the electronic output node m. Specifically, when the OLED display device lies in a working state, the switching element in the protective circuit is turned off, and at this time, the protective circuit does not work in the working state of the OLED display device. When the OLED display device is switched to a non-working state, cathode connection in the OLED working circuit is disconnected, and the switching element in the protective circuit is turned on. At this time, the protective circuit starts to work, and electrons are provided continuously from a negative electrode of a power supply to a cathode that is connected to an electronic output node. Thus, when external water and oxygen enter a cathode layer, they will not react with electrons of the cathode metal, but react with electrons provided by the power supply. Consequently, the situation that a cathode layer is corroded by water and oxygen when an OLED display device is in a non-working state is avoided, and the service life and performance of the OLED display device are promoted.

In an embodiment of the present disclosure, there is further provided an OLED display device, which includes any of the above-mentioned protective circuits. The protective circuit may be embedded within the OLED display device, and may also be provided on a sidewall of the OLED display device or any other non-display region in an add-on manner.

According to some embodiments of the present disclosure, there is further provided a method for protecting a cathode layer of an OLED display device. The method includes providing a negative potential to a cathode layer of the OLED display device in a non-working state of the OLED display device.

In some examples, the negative potential provided to a cathode layer of the OLED display device is the same as potential of the cathode layer in a working state of the OLED display device. For example, the negative potential is provided by a power supply.

Descriptions made above are merely exemplary embodiments of the present invention, but are not used to limit the protection scope of the invention. The protection scope of the invention is determined by attached claims.

This application claims the benefit of priority from Chinese patent application No. 201510379888.9, filed on Jul. 1, 2015, and the disclosure of which is incorporated herein in its entirety by reference as a part of the present application.

The invention claimed is:

1. A protective circuit for a cathode layer, applied to a non-working state of an organic light-emitting diode display device, wherein the protective circuit comprises a power supply, and an electronic output node electrically connected with a negative electrode of the power supply, wherein an electric potential of the electronic output node is the same as an electric potential of the cathode layer in a working state of the organic light-emitting diode display device, the electronic output node is connected to the cathode layer of the organic light-emitting diode display device, and a positive electrode of the power supply is connected to a voltage node with any potential other than an anode of the organic light-emitting diode display device via a wire, so that electrons can be continuously provided by the power supply to the cathode layer in a non-working state of the organic light-emitting diode display device, and wherein a voltage of the power supply is equal to a working voltage of the organic light-emitting diode display device, and the protective circuit further comprises a switching element, one end of the switching element is connected to the negative electrode of the power supply, and the other end of the switching element is connected to the cathode layer by the electronic output node.

2. The protective circuit claimed as claim 1, wherein in a working state of the organic light-emitting diode display device, the switching element is turned off, so that connection between the negative electrode and the cathode layer is disconnected, and in a non-working state of the organic light-emitting diode display device, the switching element is turned on, so that the negative electrode is connected to the cathode layer.

3. The protective circuit claimed as claim 1, wherein the positive electrode of the power supply is grounded via a wire.

4. An organic light-emitting diode display device, comprising the protective circuit of claim 1.

5. The OLED display device claimed as claim 4, wherein the positive electrode of the power supply is grounded via a wire.

6. The OLED display device claimed as claim 4, further comprising a packaging structure disposed on the cathode layer.

7. A protective circuit for a cathode layer, applied to a non-working state of an organic light-emitting diode display device, wherein the protective circuit comprises a power supply, and an electronic output node electrically connected with a negative electrode of the power supply, wherein an electric potential of the electronic output node is the same as an electric potential of the cathode layer in a working state of the organic light-emitting diode display device, the electronic output node is connected to the cathode layer of the organic light-emitting diode display device, and a positive electrode of the power supply is connected to a voltage node with any potential other than an anode of the organic light-emitting diode display device via a wire, so that electrons can be continuously provided by the power supply to the cathode layer in a non-working state of the organic light-emitting diode display device, and wherein a voltage of the power supply is greater than a working voltage of the organic light-emitting diode display device, and the protective circuit further includes a voltage adjuster, configured for adjusting the electric potential of the electronic output node, wherein a negative electrode of the power supply is electrically connected with the electronic output node through the voltage adjuster, and the protective circuit further comprises a switching element, which is disposed between the electronic output node and the voltage adjuster.

8. The protective circuit claimed as claim 7, wherein the positive electrode of the power supply is grounded via a wire.

9. An organic light-emitting diode display device, comprising the protective circuit of claim 7.

10. The organic light-emitting diode display device claimed as claim 9, wherein the positive electrode of the power supply is grounded via a wire.

11. The organic light-emitting diode display device claimed as claim 9, further comprising a packaging structure disposed on the cathode layer.

* * * * *